(12) United States Patent
Spina et al.

(10) Patent No.: US 9,978,511 B2
(45) Date of Patent: May 22, 2018

(54) GALVANIC ISOLATION SYSTEM, APPARATUS AND METHOD

(71) Applicant: STMicroelectronics S.r.l., Agrate Brianza (IT)

(72) Inventors: Nunzio Spina, Catania (IT); Egidio Ragonese, Aci Catena (IT); Giuseppe Palmisano, S. Giovanni la Punta (IT); Nunzio Greco, Bronte (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 39 days.

(21) Appl. No.: 15/163,430

(22) Filed: May 24, 2016

(65) Prior Publication Data
US 2017/0154727 A1 Jun. 1, 2017

(30) Foreign Application Priority Data
Dec. 1, 2015 (IT) ................. 10201578808

(51) Int. Cl.
| | |
|---|---|
| H01P 5/02 | (2006.01) |
| H01F 38/14 | (2006.01) |
| H02M 7/06 | (2006.01) |
| H02J 50/12 | (2016.01) |
| H03B 15/00 | (2006.01) |
| H04B 5/00 | (2006.01) |
| H04B 3/00 | (2006.01) |

(52) U.S. Cl.
CPC .............. *H01F 38/14* (2013.01); *H02J 50/12* (2016.02); *H02M 7/06* (2013.01); *H03B 15/00* (2013.01); *H04B 5/0037* (2013.01); *H01F 2038/143* (2013.01); *H01F 2038/146* (2013.01)

(58) Field of Classification Search
CPC .. H01P 5/00; H01P 7/08; H03H 2/005; H04B 5/00; H02J 50/12
USPC ........................................................ 333/24 R
See application file for complete search history.

(56) References Cited

U.S. PATENT DOCUMENTS

| | | | |
|---|---|---|---|
| 6,466,126 B2 * | 10/2002 | Collins ................ | G06F 1/3203 340/333 |
| 7,489,526 B2 | 2/2009 | Chen et al. | |
| 7,701,732 B2 * | 4/2010 | Ranstad ................ | B03C 3/68 363/132 |
| 7,706,154 B2 | 4/2010 | Chen et al. | |
| 7,737,871 B2 | 6/2010 | Leung et al. | |
| 7,983,059 B2 | 7/2011 | Chen | |

(Continued)

FOREIGN PATENT DOCUMENTS

WO   WO-2005122423 A2   12/2005

OTHER PUBLICATIONS

"Surging Across the Barrier: Digital Isolators Set the Standard for Reinforced Insulation," Analog Devices, Inc., Tech. Article, 2012, MS-2341 (5 pages).

(Continued)

*Primary Examiner* — Dean Takaoka
(74) *Attorney, Agent, or Firm* — Crowe & Dunlevy (57) ABSTRACT

A galvanic isolation system includes a first isolation barrier and a second isolation barrier. The first isolation barrier includes a transformer. The second isolation barrier includes an inductive circuit connected to a secondary winding of the transformer. The first and the second isolation barriers are coupled to form an LC resonant network.

23 Claims, 5 Drawing Sheets

(56) References Cited

U.S. PATENT DOCUMENTS

| | | | | |
|---|---|---|---|---|
| 8,084,894 | B2* | 12/2011 | Chen | H03K 17/6874 |
| | | | | 307/140 |
| 8,364,195 | B2* | 1/2013 | Spina | H01Q 1/38 |
| | | | | 307/104 |
| 8,610,312 | B2* | 12/2013 | Kikuchi | H01Q 1/248 |
| | | | | 307/104 |
| 8,618,630 | B2* | 12/2013 | Kaeriyama | H04L 25/4902 |
| | | | | 257/531 |
| 8,674,486 | B2 | 3/2014 | Haigh et al. | |
| 8,680,690 | B1 | 3/2014 | Steeneken et al. | |
| 8,861,229 | B2* | 10/2014 | Alfano | H03K 17/691 |
| | | | | 323/299 |
| 8,912,906 | B2* | 12/2014 | Taniguchi | G06K 7/0008 |
| | | | | 340/572.4 |
| 2004/0189271 | A1 | 9/2004 | Hansson et al. | |
| 2004/0210349 | A1 | 10/2004 | Lenz et al. | |
| 2004/0217749 | A1 | 11/2004 | Orr et al. | |
| 2007/0121832 | A1 | 5/2007 | Ghoshal | |
| 2008/0181316 | A1 | 7/2008 | Crawley et al. | |
| 2008/0192509 | A1 | 8/2008 | Dhuyvetter et al. | |
| 2008/0231211 | A1 | 9/2008 | Baarman et al. | |
| 2008/0267212 | A1 | 10/2008 | Crawley et al. | |
| 2009/0168462 | A1 | 7/2009 | Schopfer et al. | |
| 2009/0327783 | A1 | 12/2009 | Doss | |
| 2010/0052630 | A1 | 3/2010 | Chen | |
| 2012/0099345 | A1 | 4/2012 | Zhao et al. | |
| 2012/0256290 | A1 | 10/2012 | Renna et al. | |
| 2013/0188399 | A1 | 7/2013 | Tang et al. | |
| 2014/0253225 | A1 | 9/2014 | Lee et al. | |
| 2014/0268917 | A1 | 9/2014 | Ma et al. | |
| 2014/0292419 | A1 | 10/2014 | Ragonese et al. | |
| 2014/0313784 | A1 | 10/2014 | Strzalkowski | |
| 2015/0123749 | A1* | 5/2015 | Li | H01L 24/00 |
| | | | | 333/24 R |
| 2015/0180528 | A1 | 6/2015 | Ragonese et al. | |
| 2015/0326127 | A1 | 11/2015 | Peng et al. | |
| 2015/0364249 | A1 | 12/2015 | Palumbo et al. | |
| 2016/0080181 | A1* | 3/2016 | Yun | H04L 27/04 |
| | | | | 375/312 |

OTHER PUBLICATIONS

Cantrell: "Reinforced Isolation in Data Couplers," Analog Devices, Inc., Tech. Article, 2011, MS-2242 (4 pages).
Chen: "Fully Integrated Isolated DC-DC Converter Using Micro Transformers," Proc. IEEE Applied Power Electronics Conference and Exposition, (APEC), pp. 335-338, Feb. 2008.
Chen: "Isolated Half-Bridge Gate Driver With Integrated High-Side Supply," Proc. IEEE Power Electronics Specialists Conf. (PESC) pp. 3615-3618, Jun. 2008.
Chen: "Microtransformer Isolation Benefits Digital Control," Power Electronics Technology, pp. 20 25, Oct. 2008.
Greco et al: "A Galvanically Isolated DC-DC Converter Based on Current-Reuse Hybrid-Coupled Oscillators," IEEE Trans. Circuits Syst. II, early access Mar. 2016 (5 pages).
Kamath et al: "High-Voltage Reinforced Isolation: Definitions and Test Methodologies," Texas Instruments, Tech. Article, Nov. 2014, SLYY063 (10 pages).
Lombardo et al: "A Fully-Integrated Half-Duplex Data/Power Transfer System With Up to 40Mbps Data Rate, 23mW Output Power and On-Chip 5kV Galvanic Isolation," IEEE International Solid-State Circuits Conference (ISSCC), San Francisco, USA, Feb. 2016, pp. 300-301.
Marwat: "Digital Isolators Compliance to IEC 61010-1 Edition 3.0 Safety Requirements," Texas Instruments, White Paper, 2014, SLYY055 (5 pages).
Spina, et al: "Current-Reuse Transformer Coupled Oscillators With Output Power Combining for Galvanically Isolated Power Transfer Systems," IEEE Transaction on Circuits and Systems I, vol. 62, pp. 2940-2948, Dec. 2015.
Cantrell, Mark: "Reinforced Isolation in Data Couplers," Analog Devices, Technical Article MS-2242, Dec. 2011 (4 pages).
"Surging Across the Barrier: Digital Isolators Set the Standard for Reinforced Insulation," Analog Devices, Technical Article MS-2341, Jun. 2012 (5 pages).
Chen, Baoxing: "Fully Integrated Isolated DC-DC Converter Using Micro-Transformers," Feb. 2008, IEEE, Applied Power Electronics Conference and Exposition, (APEC), pp. 335-338.
Chen, Baoxing: "Isolated Half-Bridge Gate Driver with Integrated High-Side Supply," Proc. IEEE Power Electronics Specialists Conf. (PESC) Jun. 2008, pp. 3615-3618.
Kamath, Anant S. et al: "High-Voltage Reinforced Isolation: Definitions and Test Methodologies," Texas Instruments, Technical Article, Nov. 2014 (10 pages).
Marwat, Saleem: "Digital Isolators Compliance to IEC 61010-1 Edition 3.0 Safety Requirements," Texas Instruments, White Paper, Jan. 2014, SLYY055 (5 pages).
"Techniken Zur Galvanischen Trennung von Schaltungen Und Deren Praktische Umsetzung," Technology Day, Nürnberg Jun. 18, 2009, Texas Instruments Inc. (54 pages).
IT Search Report and Written Opinion for IT 102015000078808 dated Aug. 22, 2016 (7 pages).
Wayne, Scott: "iCoupler(R) Digital Isolators Protect RS-232,RS-485, and CAN Buses in Industrial, Instrumentation, and Computer Applications," www.analog.com, Analog Dialogue 39-10, Oct. 2005, (4 pages).

* cited by examiner

FIG. 4

GALVANIC ISOLATION SYSTEM, APPARATUS AND METHOD

PRIORITY CLAIM

This application claims priority from Italian Application for Patent No. 102015000078808 filed Dec. 1, 2015, the disclosure of which is incorporated by reference.

TECHNICAL FIELD

The description relates to galvanic isolation systems.

One or more embodiments may be used in various applications involving galvanic isolation such as e.g. isolated gate drivers, medical devices or isolated sensors.

BACKGROUND

Isolated data/power transfer with reinforced galvanic isolation has attracted continuing development based on various approaches.

A possible approach may involve e.g. integrated high-voltage capacitors. Based on that approach, capacitors may be integrated with a thick isolating layer (e.g. $SiO_2$) to achieve galvanic isolation. Isolation rating values higher than 5 kV may involve both technological and cost issues; these may be penalizing in terms of larger area due to a lower capacitance density. Also, in certain implementations only data transfer (and no power transfer) may be achieved while common-mode transient immunity (dV/dt) may become a critical factor due to high capacitive coupling.

Another approach may involve post-processed isolation transformers, possibly using polyimide isolation layers. Isolation rating values higher than 5 kV may be achieved with thick layers (e.g. >20 micron) at the cost of a lower magnetic coupling. Transfer of both data and power may be available e.g. with different transformer links.

Still another approach may involve integrated isolation transformers, e.g. fully integrated e.g. in standard Si technologies (e.g. BCD). Isolation rating values up to 5 kV may be obtained with e.g. thick $SiO_2$ layers for instance between MTL4-MTL3. Isolation rating values up to 6 kV can be achieved by exploiting lower metal layers, as well. Transfer of both data and power may be available on a same transformer link. Reinforced isolation is hardly achievable due to limitations in oxide thickness.

Still further approaches may involve increasing the isolation rating by series-coupled isolation devices. For instance, series capacitors or transformers may be exploited to improve the isolation rating (possibly by doubling it) without increasing the isolation layer thickness. In such implementations, data transfer may be implemented while high losses due to series isolation transformers may prevent effective power transfer.

Despite the extensive activity in that area, a demand is still felt for improved galvanic isolation arrangements.

SUMMARY

According to one or more embodiments, a galvanic isolation system is provided.

One or more embodiments may also relate to corresponding apparatus (e.g. an isolated gate-driver, medical device, an isolated sensor, and so on) and a corresponding method.

One or more embodiments may offer one or more of the following advantages: a fully integrated solution (i.e., a two-chip system) may be provided e.g. for reinforced galvanic isolation in a 5-kV technology platform; compatibility with data and, primarily power transfer with high efficiency; and robustness against voltage transients, e.g. due to the parasitic capacitance of the isolation transformer playing a significant role.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

The following reference documents are referred to in the description by means of reference numerals between brackets (e.g. [X]), with the numeral indicating the document in the list of documents (all incorporated herein by reference):

[1] S. Marwat, "Digital isolators compliance to IEC 61010-1 edition 3.0 safety requirements," Texas Instruments, White paper, 2014, SLYY055.

[2] B. Chen, "iCoupler® products with isoPower™ technology: signal and power transfer across isolation barrier using microtransformers," Technical Article, Analog Devices, USA. Available: http://www.analog.com/static/imported files/overviews/isoPower.pdf.

[3] United States Patent Application Publication No. 2010/0052630 A1.

[4] B. Chen, "Fully integrated isolated dc-dc converter using microtransformers," in Proc. IEEE Applied Power Electronics Conference and Exposition, (APEC), pp. 335-338, February 2008.

[5] B. Chen, "Isolated half-bridge gate driver with integrated high-side supply," Proc. IEEE Power Electronics Specialists Conf. (PESC) pp. 3615 3618, June 2008.

[6] Italian Application for Patent No. MI2014A001088.
[7] F. Pulvirenti, G. Cantone, G. Lombardo, M. Minieri, "Dispositivi con isolamento galvanico integrato", in Convegno Annuale 2014 dalla ricerca all'impresa: necessità di un trasferimento più efficace, Trieste, September 2014.
[8] "Surging across the barrier: Digital isolators set the standard for reinforced insulation," Analog Devices, Inc., Tech. article, 2012, MS-2341.
[9] A. S. Kamath and K. Soundarapandian, "High-voltage reinforced isolation: Definitions and test methodologies," Texas Instruments, Tech. article, November 2014, SLYY063.
[10] M. Cantrell, "Reinforced isolation in data couplers," Analog Devices, Inc., Tech. article, 2011, MS-2242.
[11] U.S. Pat. No. 7,737,871 B2.
[12] United States Patent Application Publication No. 2015/0180528 A1.

A large number of applications involve the transfer of data and/or power through a galvanic isolation barrier of e.g. several kilovolts (i.e., 1-10 kV). Applications of these systems may cover different fields such as industrial (e.g. high-side drivers), medical (e.g., implantable devices), isolated sensor interfaces and lighting.

As already discussed, different isolation approaches may be adopted, based e.g. on capacitive or inductive coupling.

For instance, either post-processed or integrated isolation capacitors may be adopted to perform galvanically isolated data communication (see, reference [1]). Capacitive isolators may use a two-chip solution (i.e., RX and TX), exploiting either RF amplitude modulation or impulsive transmission.

Capacitive isolator techniques may be hardly suitable for power transfer due to a highly detrimental voltage partition at the input of the power rectifier.

Transformer-based isolators may be used for data transmission, e.g. due to their reduced sensitivity to common-mode transients compared to isolation capacitors thanks to lower capacitive parasitics.

Isolation transformers may be implemented by means of post-processing steps (see, reference [2]). Post-processed isolation transformers may also be exploited to transmit power with high efficiency (see, references [3]-[5]) e.g. by using a dedicated link made up of a power oscillator and a rectifier.

Integrated transformers able to sustain several kilovolts have been also developed (see, reference [6]). Based on this technology, galvanically isolated data transfer systems are already available (see, reference [7]).

The standard VDE 0884-10 has been developed to take into account the availability of highly integrated semiconductor isolators with micro-scale isolation barriers, using either magnetic or capacitive transfer techniques. It also certifies reinforced insulation while introducing a 10-kV surge test in respect of a maximum surge isolation voltage (see, references [8]-[10]).

Current isolation approaches and architectures may be hardly capable of complying with reinforced isolation requirements, especially for power transfer applications, due to technological limitations.

A solution to achieve isolation rating as high as 10 kV is reported (see, reference [11]); that solution involves connecting two series isolation capacitors or transformers each sustaining half the isolation rating. This approach is affected by high losses and can be efficiently used only for data transfer.

Other documents of interest (all incorporated by reference) include:
"Techniken zur galvanischen Trennung von Schaltungen and deren praktische Umsetzung", Technology Day, Nürnberg 18. Juni 2009, Texas Instruments Inc.,
U.S. Pat. No. 7,706,154 B2, and
Italian Application for Patent No. 102015000050091.

Figure 1A:
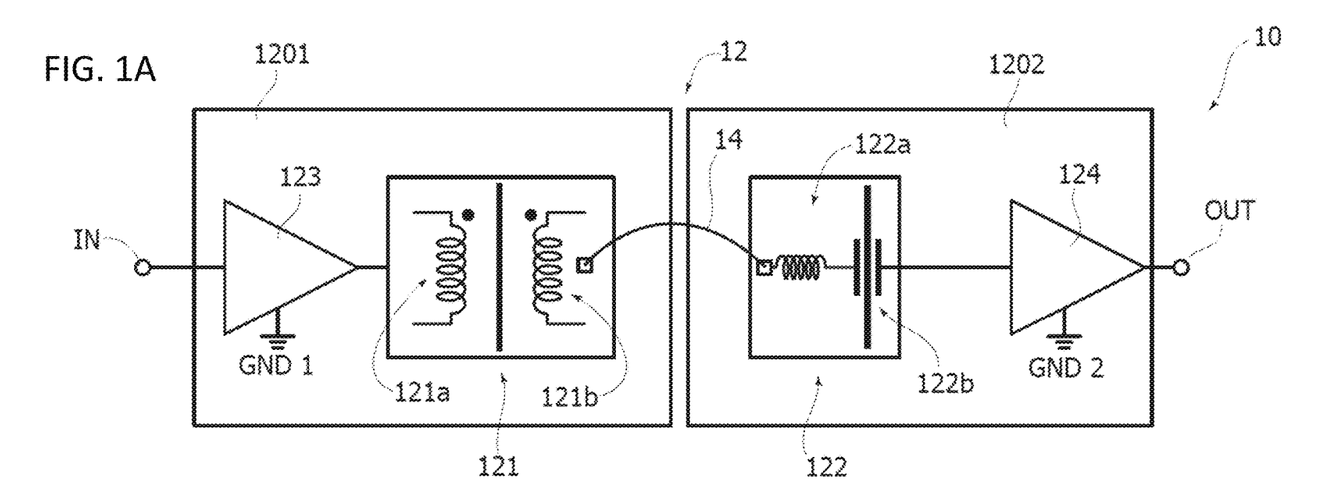
FIGS. 1A-1B are schematic block diagrams of a system for data and/or power transfer across a galvanic isolation.

FIG. 1A is generally exemplary of a system for data and/or power transfer across a galvanic isolation system 12 including a first isolation barrier 121 and a second isolation barrier 122.

In one or more embodiments, the first and second barriers 121, 122 may be implemented in integrated form.

In one or more embodiments, the system 12 may include a first chip 1201 including the first barrier 121 and a second chip 1202 including the second barrier 122.

In one or more embodiments, the first chip 1201 may include a transmitter 123 receiving input IN of data and/or power.

In one or more embodiments, the second chip 1202 may include a receiver 124 (e.g. an ac-dc power converter) for providing output OUT data and/or power as transmitted from the transmitter 123.

In one or more embodiments as exemplified in FIG. 1 the transmitter 123 may be integrated in a same chip 1201 with the first barrier 121.

In one or more embodiments as exemplified in FIG. 1 the receiver/converter 124 may be integrated in a same chip 1202 with the second barrier 122.

In one or more embodiments:
the transmitter 123 and/or the receiver/converter 124 may not be included on a same chip as the first barrier 121 and/or the second barrier 122, and
the first and second barriers 121, 122 may be integrated to a single chip (with or without the transmitter 123 and/or the receiver 124).

The partitioning over two chips 1201, 1202 as exemplified in FIG. 1 may facilitate operating the whole system with separate grounds GND1 and GND2, respectively.

In one or more embodiments, the first barrier 121 may include an isolation transformer having a primary winding 121a coupled with (e.g. driven by) the transmitter 123 and a secondary winding 121b coupled (e.g. via wiring 14) to the second barrier 122.

In one or more embodiments, the second barrier 122 may include a combination of an inductor 122a and an isolation capacitor 122b.

In one or more embodiments, in addition to a capacitor, the second barrier 122 may include an inductor, e.g. the series-coupling (e.g. the series connection) of an inductor 122a and a capacitor 122b.

In one or more embodiments, the inductor 122a may be set between the first barrier 121 and the capacitor 122b.

In one or more embodiments, the capacitor 122b may be set between the inductor 122a and the receiver/converter 124.

Figure 1B:
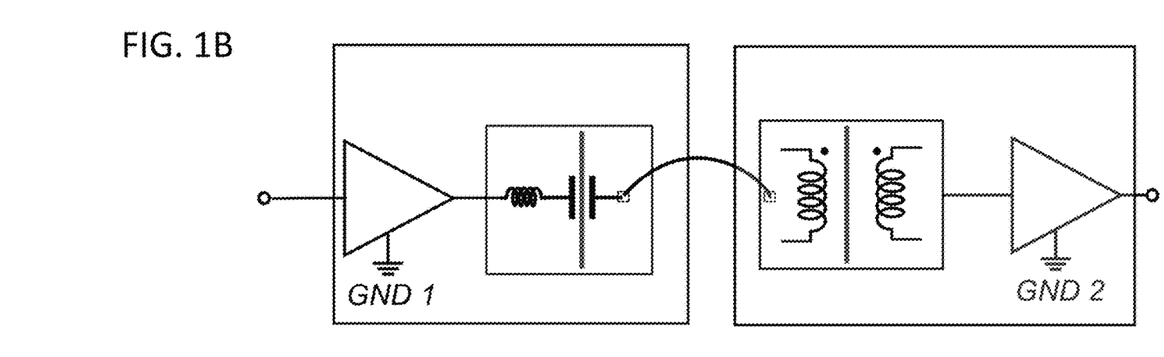

It will be understood that the circuit 122 could instead be implemented in chip 1201 for the transmit side while the circuit 121 is implemented in chip 1202 for the receive side. Such an implementation is shown in FIG. 1B.

Figure 2A:
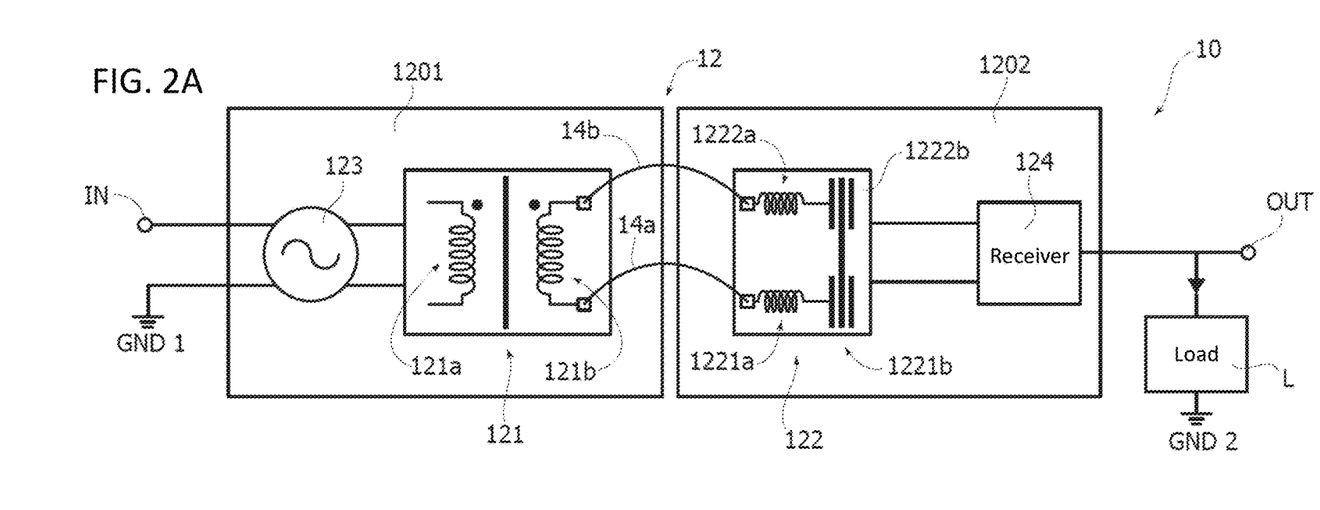
FIGS. 2A-2C are schematic block diagrams of a system for data and/or power transfer across a galvanic isolation.

In one or more embodiments as exemplified in FIG. 2A, the structure of the second barrier 122 as disclosed previously may be duplicated to include a first inductor 1221a series-coupled (e.g. series-connected) with a first capacitor 1221b and a second inductor 1222a series-coupled (e.g. series-connected) with a second capacitor 1222b.

In one or more embodiments as exemplified in FIG. 2A, coupling between the first barrier 121 and the second barrier 122 may include two separate wiring formations 14a, 14b each extending between one terminal lead of the secondary winding 121b of the transformer of the first barrier 121 and one input port of the second barrier 122, with the series coupling of an inductor and capacitor (e.g. 1221a, 1221b, and 1222a, 1222b) coupled with one of the wiring formations 14a, 14b.

In one or more embodiments as exemplified in FIG. 2A, the receiver 124 may include a rectifier (e.g. a diode or diode bridge or any other circuit adapted to act as an ac-dc converter).

The representation of FIG. 2A also includes a load L e.g. set between the output terminal OUT and ground (GND2). It will be appreciated that the load L may not be part of one or more embodiments.

Figure 2B:
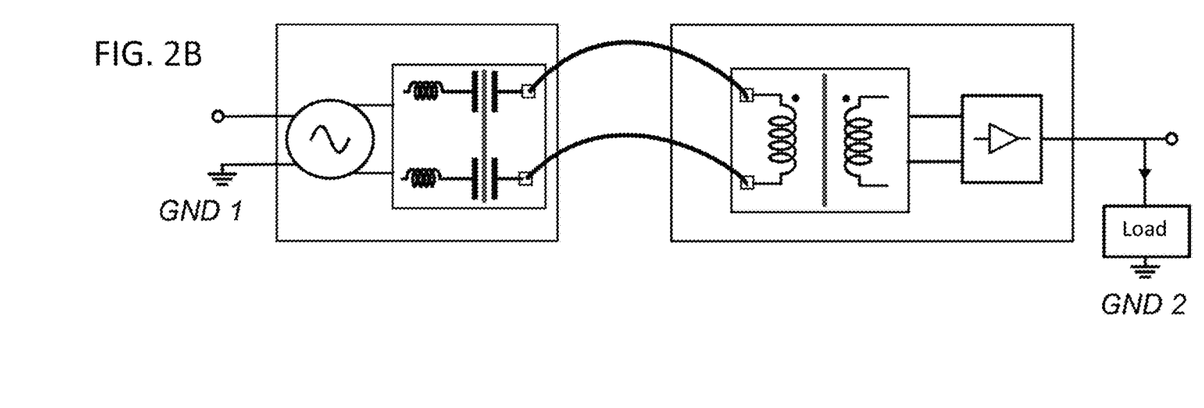

It will be understood that the circuit 122 could instead be implemented in chip 1201 for the transmit side while the circuit 121 is implemented in chip 1202 for the receive side. Such an implementation is shown in FIG. 2B.

Figure 2C:
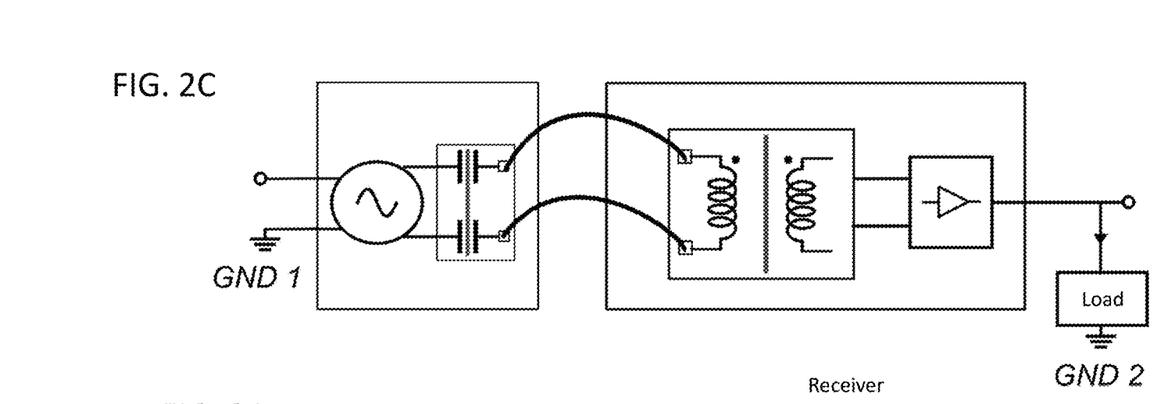

As a further modification, the inductors 1221a and 1222a may be omitted in chip 1201 for the transmit side as shown in FIG. 2C. These series inductances are not required since LC resonance is implemented with the inductive load of the oscillator 123 which is configured as an LC tank oscillator.

Figure 3A:
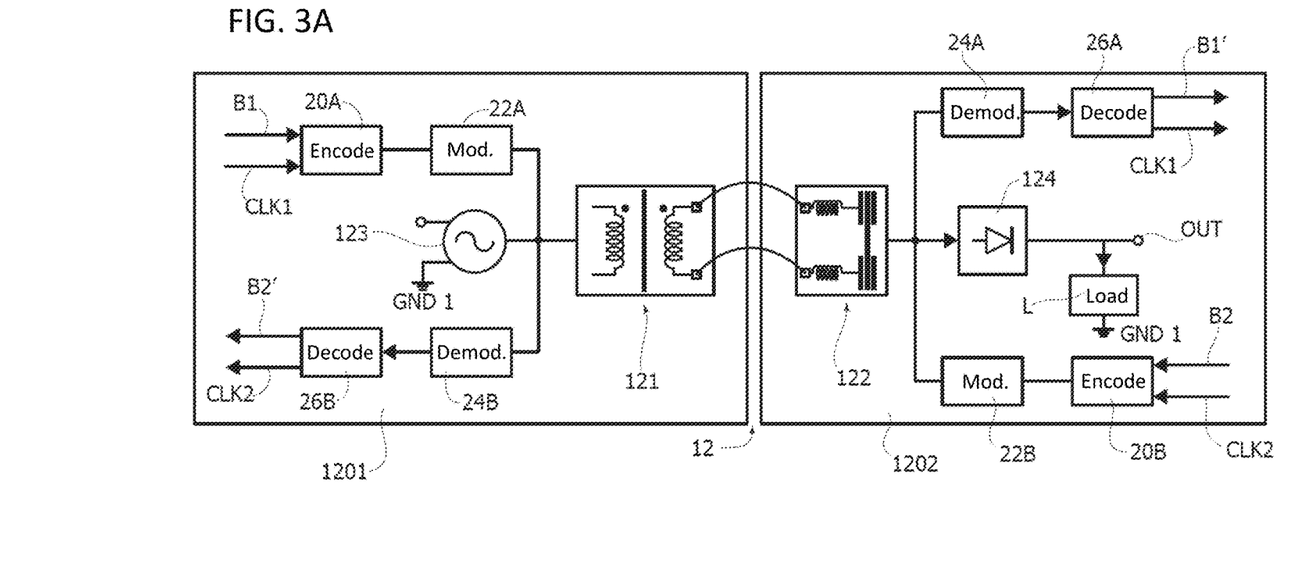
FIGS. 3A-3C are schematic block diagrams of a data/power transfer system.

FIG. 3A is exemplary of the possibility of including a double barrier arrangement (including a first barrier 121 and a second barrier 122, possibly arranged on two separate chips 1201, 1202) as exemplified in the foregoing within the framework of a combined data-power transfer system.

In one or more embodiments, such system may permit (possibly controlled) transfer of power, such as power supply energy across the (double) isolation barrier (e.g. from the left hand-side to the right hand-side of FIG. 3) while also admitting data transmission.

In one or more embodiments, data transmission may be bidirectional (e.g. half-duplex) transmission between:
- an encoder 20A and a modulator 22A receiving an input bitstream B1 with a clock CLK 1 to be recovered on the other side of the barrier 12 via a demodulator 24A and a decoder 26A to produce a recovered bitstream B1' at clock CLK1, and
- an encoder 20B and a modulator 22B receiving an input bitstream B2 with a clock CLK 2 to be recovered on the other side of the barrier 12 via a demodulator 24B and a decoder 26B to produce a recovered bitstream B2' at clock CLK3.

In one or more embodiments, an isolation boost may be achieved via the two isolation barriers 121, 122 as the transformer 121 and the inductor/isolated capacitor arrangement(s) 122a, 122b (FIG. 1) or 1221a, 1221b and 1222a, 1222b (FIG. 2) giving rise jointly to an LC resonant network which may permit both power and data transfer with high efficiency.

One or more embodiments thus make it possible to implement a data and/or power transfer link with reinforced isolation (e.g. 10 kV) by using a fully integrated approach in e.g. a two-chip solution 1201, 1202.

One or more embodiments may rely on the concept of using of at least two (different) isolation devices into a resonant network able to transfer RF-modulated data and/or RF power across two isolation barriers 121, 122, as depicted in the figures.

In one or more embodiments, using two cascaded isolation devices 121, 122 may permit a "double" isolation rating to be achieved. This may make it possible to use a conventional 5-kV isolation platform also for reinforced applications.

In one or more embodiments, a LC resonant approach may achieve high efficiency (e.g., low loss) transfer, especially for power applications.

In one or more embodiments as exemplified herein the isolation devices coupled to form an LC resonant network may include a transformer (barrier 121) and a series capacitor (e.g. 122b or 1221b, 1222b-barrier 122).

In one or more embodiments as exemplified herein, in order to facilitate resonance of the isolation network, an e.g. on-chip inductor (e.g. 122a; 1221a, 1222a) may be added, whose inductance value may be tuned with the capacitance of the capacitor (e.g. 122b; 1221b, 1222b).

In one or more embodiments, a low resistance connection (e.g. 14, 14a, 14b) may be obtained between the secondary winding 121b and the receiver block at the resonance frequency (e.g. the frequency of a RF carrier).

While a simple LC resonant network as exemplified herein may provide low losses in the transfer across the isolation barriers 121, 122, the same underlying concept may be applied to more complex resonant networks.

Certain embodiments as exemplified in FIG. 3A may provide a power transfer link, including a transformer-loaded power oscillator and a rectifier. Correct operation of such embodiments may be facilitated by avoiding a capacitive partition at the input of the rectifier 124 so that power efficiency is preserved.

In one or more embodiments this may be obtained via a LC resonance effect with a reduction of the silicon area in comparison with arrangements using isolation capacitors (much) higher than the rectifier input capacitance e.g. in the order of pF.

One or more embodiments may be compatible with the arrangements disclosed in reference [12] or Italian Appli-cantion for Patent No. 102015000050091 for power and data transfer on a same transformer-based isolated channel.

Figure 3B:
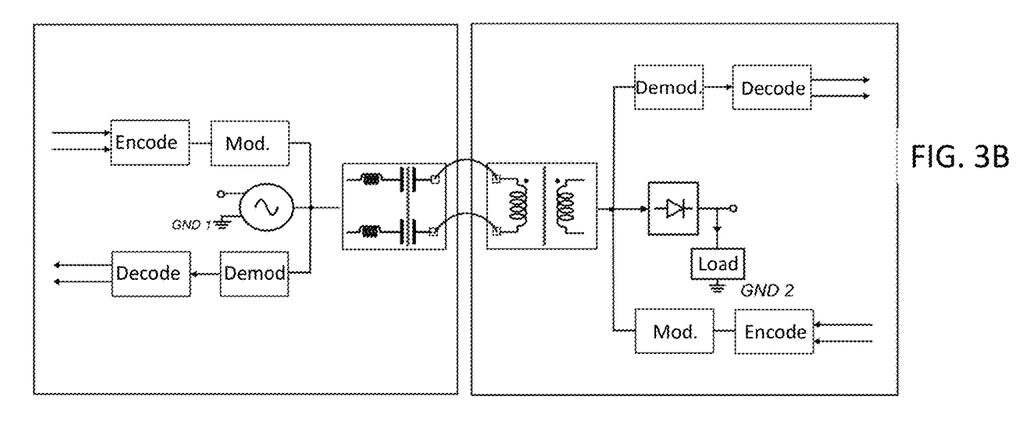

It will be understood that the circuit 122 could instead be implemented in chip 1201 for the transmit side while the circuit 121 is implemented in chip 1202 for the receive side. Such an implementation is shown in FIG. 3B.

Figure 3C:
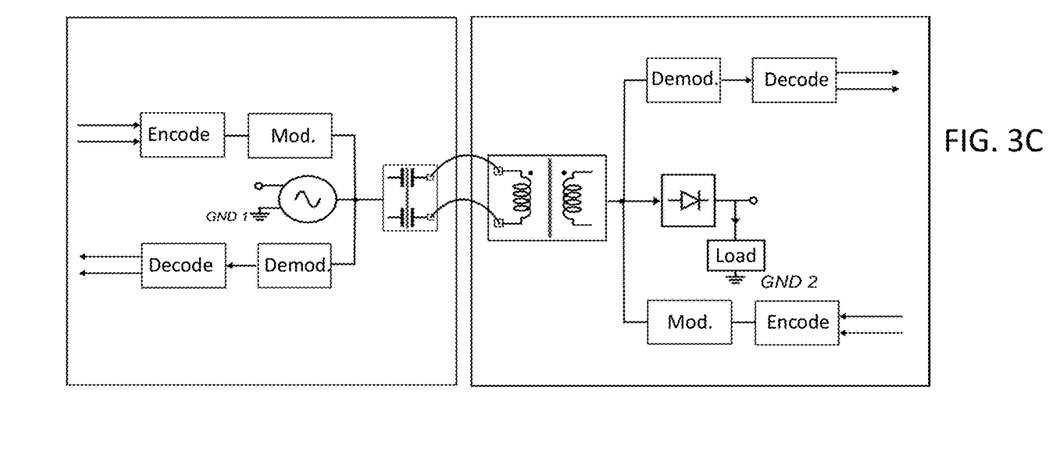

As a further modification, the inductors 1221a and 1222a may be omitted in chip 1201 for the transmit side as shown in FIG. 3C. These series inductances are not required since LC resonance is implemented with the inductive load of the oscillator 123 which is configured as an LC tank oscillator.

Figure 4:
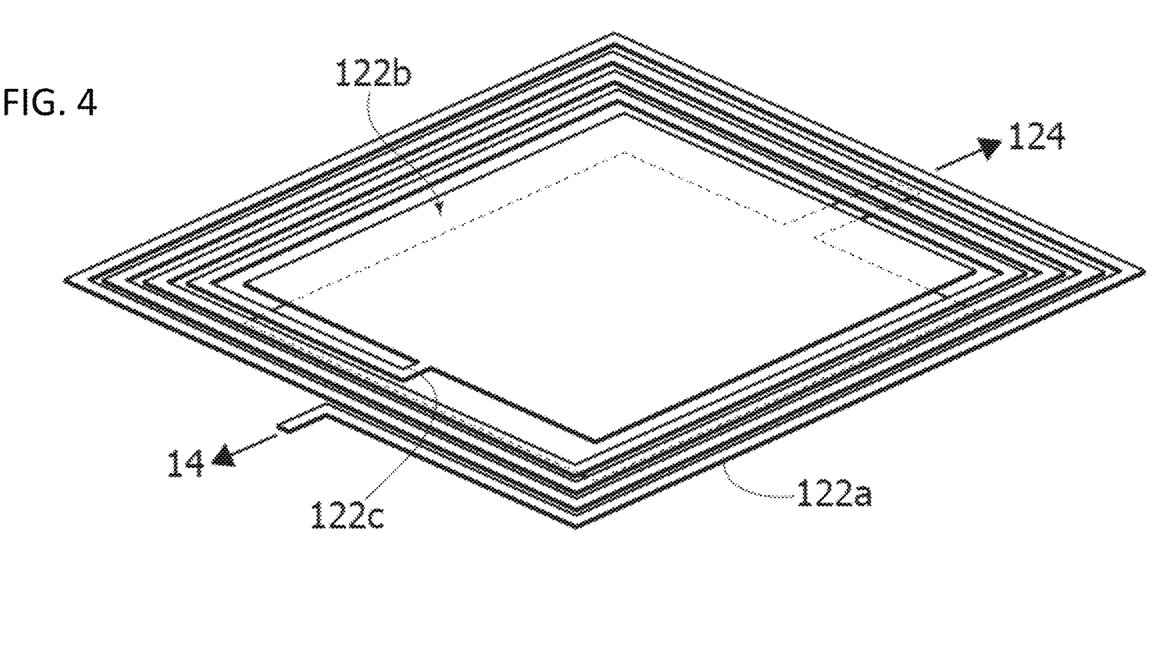
FIG. 4 is a schematic representation of a component adapted for use in a system for data and/or power transfer across a galvanic isolation.

FIG. 4 shows an exemplary integrated implementation of a LC series network of the barrier 122. In one or more embodiments, this may include an (integrated) isolation capacitor 122b series-connected (e.g. at 122c) to a spiral inductor 122a that is wound around it.

In one or more embodiments, a judicious choice of the distance between the two components may reduce power losses due to induced eddy currents or to a reduction of the isolation strength between the metal plates of the isolation capacitor(s).

One or more embodiments may provide a fully integrated solution possibly including two integrated circuits (e.g. 1201, 1202).

In one or more embodiments, a 5 kV isolation value may be achieved with conventional technology (e.g. bipolar-CMOS-DMOS, BiCMOS or BCD) leading to integrated circuits with reinforced isolation.

In one or more embodiments, a proper sizing of the isolation devices may permit to implement a resonant network capable of transferring data or power with high efficiency across two galvanic barriers.

In one or more embodiments, additional on-chip components (e.g. inductors) may be included to improve matching and efficiency.

In one or more embodiments, a fully integrated system for reinforced galvanic isolated power transfer may be implemented by using a transformer-loaded power oscillator and a rectifier/converter (e.g. 124).

Without prejudice to the underlying principles, the details and embodiments may vary, even significantly, with respect to what has been disclosed by way of example only, without departing from the extent of protection.

The extent of protection is defined by the annexed claims.

The invention claimed is:

1. A galvanic isolation system, comprising:
   a first isolation barrier including a transformer, and
   a second isolation barrier cascaded to said first isolation barrier, said second isolation barrier including a first series coupling of an inductor and a capacitor, wherein the first and the second isolation barriers are ohmically connected to form an LC resonant network.

2. The galvanic isolation system of claim 1, wherein said first series-coupling of the inductor and the capacitor is connected to a first terminal of a secondary winding of the transformer of the first isolation barrier, and further comprising:
   a second series-coupling of an inductor and a capacitor, said second series-coupling being connected to a second terminal of the secondary winding of the transformer of the first isolation barrier.

3. The galvanic isolation system of claim 1, wherein the first and second isolation barriers are respectively integrated to two separated integrated circuit chips.

4. A galvanic isolation system, comprising:
   a first isolation barrier comprising a first series coupling of an inductor and a capacitor, and
   a second isolation barrier including a transformer cascaded to said first isolation barrier, wherein the first and the second isolation barriers are ohmically connected to form an LC resonant network.

5. The galvanic isolation system of claim 4, wherein said first series-coupling of the inductor and the capacitor is connected to a first terminal of a primary winding of the transformer of the second isolation barrier, and further comprising:
   a second series-coupling of an inductor and a capacitor, the second series-coupling being ohmically connected to a second terminal of the primary winding of the transformer of the second isolation barrier.

6. The galvanic isolation system of claim 4, wherein capacitor is ohmically connected to a first terminal of a primary winding of the transformer of the second isolation barrier.

7. The galvanic isolation system of claim 6, further comprising a tank oscillator coupled in series with said capacitor.

8. The galvanic isolation system of claim 6, wherein the first isolation barrier further includes a further capacitor that is ohmically connected to a second terminal of the primary winding of the transformer of the second isolation barrier.

9. The galvanic isolation system of claim 4, wherein the first and second isolation barriers are respectively integrated to two separated integrated circuit chips.

10. An apparatus, comprising:
    a galvanic isolation system comprising:
      a first isolation barrier including a transformer, and
      a second isolation barrier cascaded to said first isolation barrier, said second isolation barrier including a first series coupling of an inductor and a capacitor, wherein the first and the second isolation barriers are ohmically connected to form an LC resonant network; and
    at least one of:
      a data transmitter coupled to one of said first and second isolation barriers and a data receiver coupled to another of said first and second isolation barriers,
      a power source coupled to one of said first and second isolation barriers and an ac-dc power converter coupled to another of said first and second isolation barriers.

11. The apparatus of claim 10, wherein said ac-dc power converter includes a rectifier.

12. The apparatus of claim 10, wherein said first series-coupling of the inductor and the capacitor is connected to a first terminal of a secondary winding of the transformer of the first isolation barrier, and further comprising:
    a second series-coupling of an inductor and a capacitor, said second series-coupling being connected to a second terminal of the secondary winding of the transformer of the first isolation barrier.

13. The apparatus of claim 10, wherein the capacitor is ohmically connected to a first terminal of a first winding of the transformer of the first isolation barrier.

14. The apparatus of claim 13, further comprising a tank oscillator coupled in series with said capacitor.

15. The apparatus of claim 13, wherein the second isolation barrier further includes a further capacitor ohmically connected to a second terminal of the first winding of the transformer of the first isolation barrier.

16. The apparatus of claim 10, wherein the first and second isolation barriers are respectively integrated to two separated integrated circuit chips.

17. A system, comprising:
    a first integrated circuit chip including a transformer having a primary winding configured to receive an input signal and a secondary winding;
    a second integrated circuit chip including an inductor-capacitor network comprising an inductor coupled in series with a capacitor;
    a wiring line connecting a terminal of the secondary winding with a terminal of the inductor-capacitor network;
    wherein the transformer and inductor-capacitor network form an LC resonant network.

18. The system of claim 17, wherein the input signal is a data signal, and wherein the first integrated circuit chip includes a data transmitter coupled supply the input signal to the transformer and wherein the second integrated circuit includes a data receiver coupled to an output of the inductor-capacitor network.

19. The system of claim 17, wherein the input signal is a power signal, and wherein the first integrated circuit chip includes a supply circuit coupled to supply the input signal to the transformer and wherein the second integrated circuit includes power converter coupled to an output of the inductor-capacitor network.

20. A system, comprising:
a first integrated circuit chip including an inductor-capacitor network configured to receive an input signal and comprising an inductor coupled in series with a capacitor;
a second integrated circuit chip including a transformer having a primary winding and a secondary winding;
a wiring line connecting a terminal of the primary winding with a terminal of the inductor-capacitor network;
wherein the transformer and inductor-capacitor network form an LC resonant network.

21. The system of claim 20, wherein the input signal is a data signal, and wherein the first integrated circuit chip includes a data transmitter coupled supply the input signal and wherein the second integrated circuit includes a data receiver coupled to the secondary winding of the transformer.

22. The system of claim 20, wherein the input signal is a power signal, and wherein the first integrated circuit chip includes a supply circuit coupled to supply the input signal and wherein the second integrated circuit includes power converter coupled to the secondary winding of the transformer.

23. The system of claim 22, wherein the supply circuit is a tank oscillator and the inductor of the inductor-capacitor network is provided by an inductive load of the tank oscillator.

* * * * *